United States Patent

Zhuo et al.

(10) Patent No.: US 11,449,754 B1
(45) Date of Patent: Sep. 20, 2022

(54) NEURAL NETWORK TRAINING METHOD FOR MEMRISTOR MEMORY FOR MEMRISTOR ERRORS

(71) Applicant: ZHEJIANG UNIVERSITY, Zhejiang (CN)

(72) Inventors: Cheng Zhuo, Zhejiang (CN); Xunzhao Yin, Zhejiang (CN); Qingrong Huang, Zhejiang (CN); Di Gao, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 17/672,713

(22) Filed: Feb. 16, 2022

(30) Foreign Application Priority Data

Sep. 12, 2021 (CN) .......................... 202111065383.7

(51) Int. Cl.
G06N 3/08 (2006.01)
G11C 13/00 (2006.01)
(52) U.S. Cl.
CPC ........... G06N 3/08 (2013.01); G11C 13/0069 (2013.01)
(58) Field of Classification Search
CPC .............................. G06N 3/08; G11C 13/0069
See application file for complete search history.

(56) References Cited

U.S. PATENT DOCUMENTS

2018/0253642 A1* 9/2018 Gokmen .............. G06N 3/0635

OTHER PUBLICATIONS

Zhou Y, Hu X F, Wang L D, et al. "Bayesian neural network enhancing reliability against conductance drift for memristor neural networks". Sci China InfSci, 2021, 64(6): 160408, https://doi.org/10.1007/s11432-020-3204-y (Year: 2021).*
Zhong, Y., Tang, J., Li, X et al. "Dynamic memristor-based reservoir computing for high-efficiency temporal signal processing". Nat Commun 12, 408 (2021). https://doi.org/10.1038/s41467-020-20692-1 (Year: 2021).*
Wang et al. ("Memristor-based neural networks with weight simultaneous perturbation training", Springer Nature B.V. Received: May 24, 2018 /Accepted: Dec. 11, 2018 /Published online: Dec. 18, 2018) (Year: 2018).*

* cited by examiner

Primary Examiner — Michael J Huntley
Assistant Examiner — Imad Kassim
(74) Attorney, Agent, or Firm — JCIPRNET

(57) ABSTRACT

The present invention discloses a neural network training method for a memristor memory for memristor errors, which is mainly used for solving the problem of decrease in inference accuracy of a neural network based on the memristor memory due to a process error and a dynamic error. The method comprises the following steps: performing modeling on a conductance value of a memristor under the influence of the process error and the dynamic error, and performing conversion to obtain a distribution of corresponding neural network weights; constructing a prior distribution of the weights by using the weight distribution obtained after modeling, and performing Bayesian neural network training based on variational inference to obtain a variational posterior distribution of the weights; and converting a mean value of the variational posterior of the weights into a target conductance value of the memristor memory.

6 Claims, 2 Drawing Sheets

NEURAL NETWORK TRAINING METHOD FOR MEMRISTOR MEMORY FOR MEMRISTOR ERRORS

CROSS-REFERENCE TO RELATED APPLICATION

This application claims the priority benefit of China application serial no. 202111065383.7, filed on Sep. 12, 2021. The entirety of the above-mentioned patent application is hereby incorporated by reference herein and made a part of this specification.

BACKGROUND

Technical Field

The present invention belongs to the field of application of artificial intelligence and computing-in-memory chips, and particularly relates to a neural network training method for a memristor memory for memristor errors, which can effectively reduce accuracy decrease caused by a process error and a dynamic error of a computing-in-memory neural network chip.

Description of Related Art

In recent years, researches related to a computing-in-memory circuit based on a memristor memory have made great progress, the basic unit memristor of the circuit is a nonvolatile storage device, a conductance value of which can be changed by applying currents of different magnitudes to both ends of the memristor, thus data stored in the memristor can be modified; and the memristors are arranged into a rectangular array according to a certain mode and are connected in the row and column directions to form a memristor storage array. At present, the memristor memory is generally used to matrix-vector product operation. By taking fully connected layer computation of a neural network as an example, it is essentially an operation in which a weight matrix and an input vector are subjected to a matrix multiplication to obtain an output vector. The weights are written into the memristor memory array in the form of memristor conductance, and the input data are input in the form of the voltage from the row direction, so that the output vector can be obtained in the form of the current in the column direction. Compared with the traditional computer systems such as CPU, GPU and the like, the memristor memory integrates two functions of storage and computation, which reduces data migration, greatly improves data throughput and computational parallelism, and lowers the energy consumption. Meanwhile, as a novel nonvolatile device, the memristor also makes the storage density of the memristor memory be greatly improved in comparison with the conventional memory. Due to excellent characteristics above, the novel computing chip based on the memristor memory has become important means for improving energy and time efficiency of data-intensive algorithms such as neural network computing and the like at present.

However, due to limitation of manufacturing process, the manufacturing of the memristor memory is almost inevitably affected by the fabrication process and the dynamic error, resulting in a certain deviation of the device parameters in the actual circuit in comparison with the target values. By taking the neural network computing as an example, the change of the device parameters may cause a certain deviation of neural network weights stored on the memristor memory in comparison with the target values thereof; in addition to the fabrication error, dynamic errors such as fluctuation and noise may also affect values of the weights, leading to a decrease in accuracy; and the influence of the problems on a large-scale memristor memory is more serious. Due to above non-ideal factors of hardware, there is still a large gap between the computational acceleration capability of the memristor memory and the dramatically increasing computational demands of complex algorithms in practical application.

SUMMARY

For the defects in the prior art, an objective of the present invention is to provide a memristor memory-oriented neural network training method for a process error and a dynamic error.

The objective of the present invention is achieved through the following technical solutions: a neural network training method for a memristor memory for memristor errors comprises the following steps:

(1) performing modeling on neural network weights to be deployed on a memristor memory under the influence of the process error and the dynamic error, which comprises the following steps:

(1-1) decomposing an actual conductance value of one memristor on the memristor memory corresponding to each weight into four parts: a target conductance value, a global conductance error, a local conductance error, and a dynamic conductance error;

(1-2) approximating the local conductance error and the dynamic conductance error as products of a value of an error function taking the target conductance value as a variable and the local process error as well as the dynamic error;

(1-3) respectively modeling the local process error and the dynamic error as Gaussian random variables, which are independent of each other;

(1-4) obtaining modeling representation of the actual conductance value of one memristor on the memristor memory corresponding to each weight under the influence of the process error and the dynamic error by means of results of the steps (1-1) to (1-3), which is a Gaussian random variable, wherein a mean value of the modeling representation is the sum of the target conductance value and the global conductance error, and a variance is a product of the value of the error function taking the target conductance value as the variable and the sum of the variances of two Gaussian random variables corresponding to the local process error and the dynamic error; and (1-5) mapping the conductance value obtained by modeling into the neural network weight by using a conductance value-weight mapping relationship, thus obtaining statistical representation of the weight;

(2) performing Bayesian neural network training based on variational posterior by taking the statistical distribution of the weights obtained by modeling in the step (1) as the prior distribution, thus obtaining the variational posterior distribution of the weights; and (3) computing a mean value of the variational posterior distribution of the weights obtained in the step (2), mapping the mean value into conductance by reversely using the conductance-weight mapping relationship, and taking the conductance as the actual conductance value of the memristor on the memristor memory.

Further, in the step (1-2), an error function taking a target conductance value as a variable is of the following form:

$$f(g_0) = cg_0$$

wherein c is a constant indicating the process error level and the dynamic error level, and is set according to the error level in an application scenario; and $g_0$ is a vector consisting of the target conductance value of each memristor on the memristor memory.

Further, in the step (1-3), a Gaussian random variable $\Delta r_l$ for representing a local process error and a Gaussian random variable $\Delta r_d$ for representing the dynamic error obtained by modeling respectively meet the following Gaussian distributions:

$$\Delta r_l \sim N(0, \sigma_l^2)$$

$$\Delta r_d \sim N(0, \sigma_d^2)$$

wherein $\sigma_l^2$ and $\sigma_d^2$ are variances of the two Gaussian distributions respectively and are measured experimentally, N indicating the Gaussian distribution.

Further, in the step (1-4), the modeling representation obtained by modeling to represent the actual conductance value of one memristor on the memristor memory corresponding to each weight under the influence of the process error and the dynamic error is of the following form:

$$g \sim N(g_0 + \Delta g_g, f(g_0 + \Delta g_g)^2 (\sigma_l^2 + \sigma_d^2))$$

wherein g is the actual conductance value, $g_0$ is the target conductance value, $\Delta g_g$ is the global conductance error, and $\sigma_l^2$ and $\sigma_d^2$ are variances of two Gaussian distributions respectively, and parameters are all measured experimentally.

Further, in the step (1-5), the i element $w_i$ of the neural network weight $w = [w_1, w_2, \ldots, w_i, \ldots, w_n]^T$ obtained through the conductance value-weight mapping relationship is of the following form:

$$w_i = c_1 g_i \sim N(\mu_i)) = N(c_0 + c_1(g_{0,i} + \Delta g_{g,i})^2(\sigma_{l,i}^2 + \sigma_{d,i}^2))$$

wherein $g_i$ is an actual conductance value of a memristor corresponding to the i weight, $\mu_i$ and $\Psi(\mu_i)$ are a mean value and a variance of $w_i$, $g_{0,i}$ target conductance value of the memristor corresponding to the i weight, $\Delta g_{g,i}$ is a global conductance error of the memristor corresponding to the i weight, $\sigma_{l,i}^2$ and $\sigma_{d,i}^2$ are variances of a local process error value and a dynamic error value of the memristor corresponding to the i weight respectively, and $c_0$ and $c_1$ are two constant factors of conductance value-weight linear mapping, which are computed through the following formulas:

$$c_1 = \frac{w_{max} - w_{min}}{g_{max} - g_{min}}, \quad c_0 = w_{min} - c_1 g_{min}$$

wherein $w_{max}$ and $w_{min}$ are a maximum value and a minimum value of all weights in the neural network respectively, and can be obtained from the traditional neural network training, and $g_{max}$ and $g_{min}$ are a maximum value and a minimum value of the conductance range that can be adjusted by the memristor on the memristor memory, respectively.

Further, in the step (2), the variational posterior distribution $q(w|\theta)$ of the neural network weights w is a Gaussian distribution, $\theta$ is parameters of the Gaussian distribution, including the mean value and the variance, and a target function for Bayesian neural network training based on variational inference is of the following form:

$$-ELBO(g_0; \theta) = -\mathbb{E}_{q(w|\theta)}[\log P(D|w)] + KL[q(w|\theta)P(w)]$$

wherein $g_0$ is a vector consisting of target conductance values of various memristors on the memristor memory corresponding to all weights of the neural network, $P(D|w)$ is likelihood $\mathbb{E}$ is expectation of solving random variables, KL is a relative entropy of solving two distributions, $P(w)$ is the prior distribution of the weights, and D is a neural network training set.

The neural training method provided by the present invention has the beneficial effects that: a memristor memory-oriented neural network training method is provided, so that a model obtained by training can achieve an accuracy equivalent to that of a neural network using a traditional computer platform for inference when deployed to a memristor memory affected by a process error and a dynamic error for inference. Compared with the traditional neural network training method, the accuracy of the method provided by the present invention is greatly improved, and in a case of ensuring the accuracy, huge energy efficiency advantages of a computing architecture based on the memristor memory, in terms of neural network computing, compared with a traditional computer is fully utilized.

DESCRIPTION OF THE EMBODIMENTS

The technical solutions and effects of the present invention are further described in detail below in conjunction with the accompanying drawings.

Figure 1:
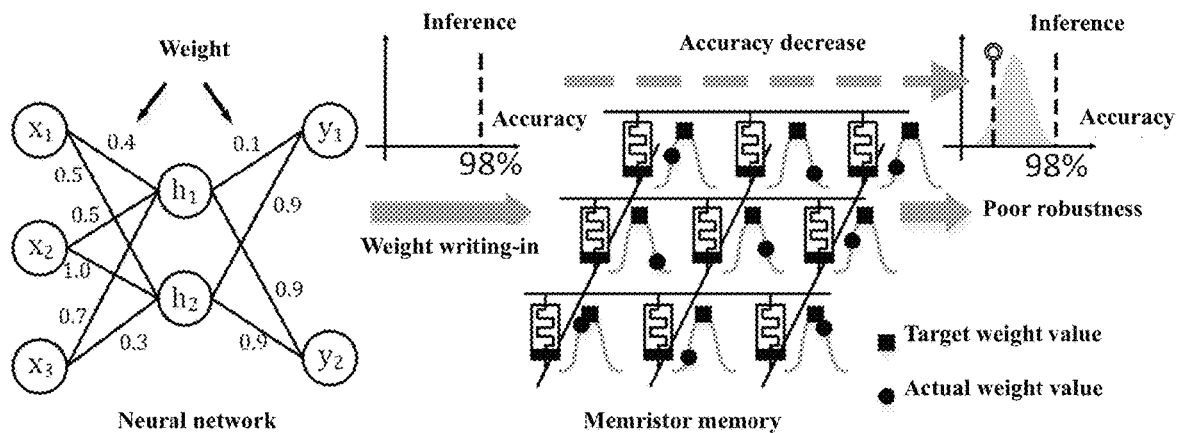
FIG. 1 is a schematic diagram describing a background and existing problems proposed by the present invention.

The memristor memory can achieve an efficient matrix-vector product operation, so that the memristor memory is often applied to scenes such as neural network computing acceleration and the like, and has received intensive attention from the academic community. A basic structure of the memristor memory is as shown in FIG. 1. At present, most memristor memories face the influence of non-ideal factors of hardware such as the process error and the dynamic error, and such influence may cause random offset of the weight value of the neural network when the weight value is written into the memristor in the form of electrical conductance, as shown in FIG. 1, so that the inference accuracy of the neural network is affected, and the amplitude of accuracy decrease can be sharply increased as the network scale increases, which limits the capability of the memristor memory to be applied to a large-scale and complex neural network.

Figure 2:
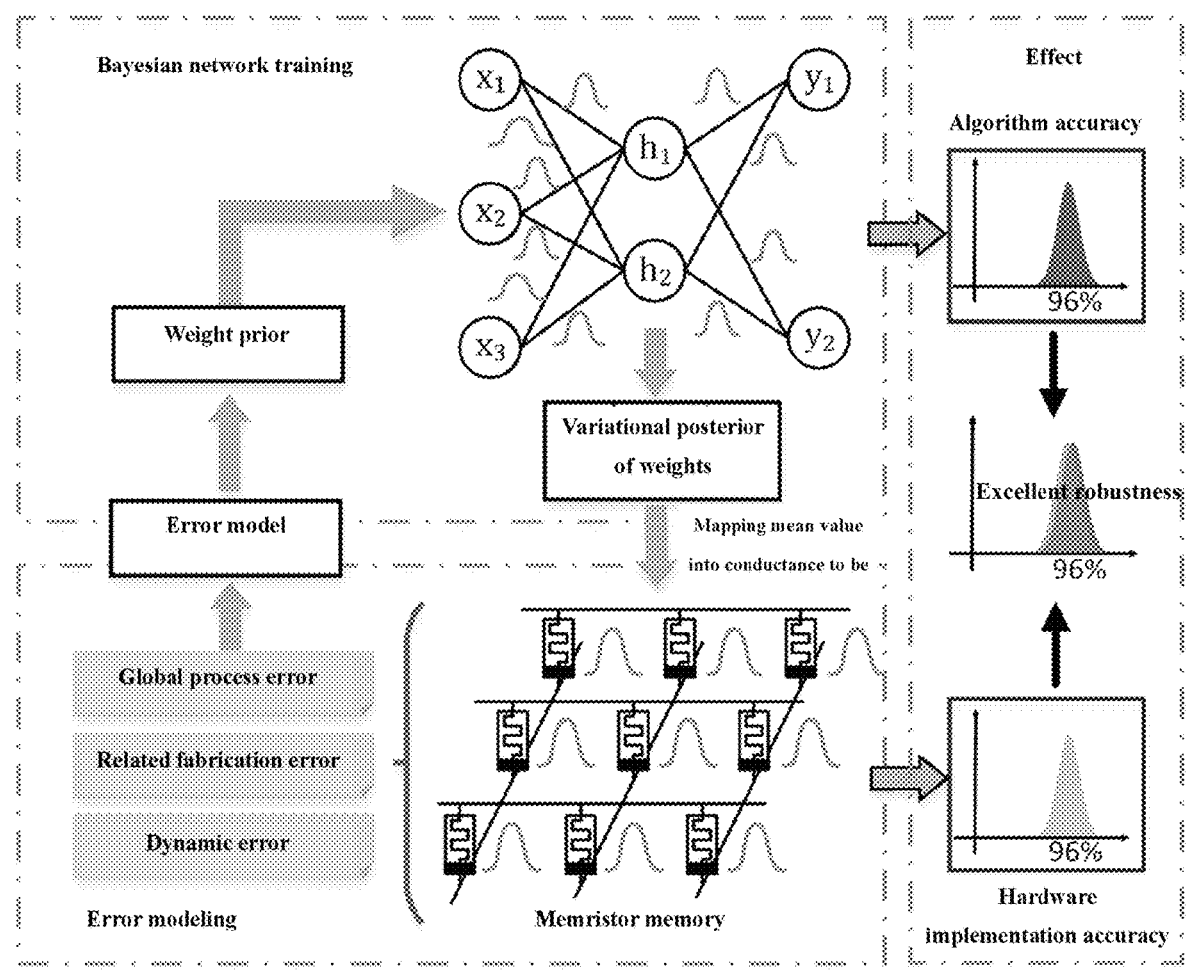
FIG. 2 is an overall process and frame diagram of the present invention.

For above problem, the present invention provides a neural network training method for a memristor memory for memristor errors, an overall process and effect diagram of which is as shown in FIG. 2, comprising specifically implementation steps as follows:

(1) performing modeling on neural network weights to be deployed on the memristor memory under the influence of non-ideal factors of the circuit such as a fabrication error, random noise and the like, with specific implementation steps as follows:

(1-1) in a case of considering the influence of non-ideal factors, decomposing actual conductance values $g = [g_1, g_2, \ldots, g_n]^T$ of n memristors on the memristor memory corresponding to the neural network weights $w = [w_1, w_2, \ldots, w_n]$ into the following four parts:

$$g = g_0 + \Delta g_g + \Delta g_l + \Delta g_d$$

wherein $g_0$ denotes a vector consisting of target conductance values of memristors on the memristor memory, $\Delta g_g$ denotes a vector consisting of the influence of the global process error (hereinafter referred to as global conductance error) on the target conductance values of the memristors on the memristor memory, the influence of the component on all devices on the same ship is the same; $\Delta g_l$ describes a vector consisting of the influence of the local process error (hereinafter referred to as local conductance error) on the target conductance values of the memristors on the memristor memory, and $\Delta g_d$ is a vector consisting of the influence of the dynamic error (hereinafter referred to as dynamic conductance error) on the target conductance values of the memristors on the memristor memory;

(1-2) applying the following approximation on the local conductance error and the dynamic conductance error:

$$\Delta g_l \approx f(g_0) \circ \Delta r_l$$

$$\Delta g_d \approx f(g_0) \circ \Delta r_d$$

wherein $\circ$ denotes a Hadamard product of a matrix, $\Delta r_l$ denotes the local process error, $\Delta r_d$ denotes the dynamic error, and $f(g_0)$ is a function taking the target conductance value $g_0$ as a unique variable, with an expression as follows:

$$f(g_0) = cg_0$$

wherein c is a constant for describing degree of influence of the error r on a conductance value of a cross-point matrix and is measured experimentally; (1-3) respectively modeling the local process error $\Delta r_l$ and the dynamic error $\Delta r_d$ as Gaussian random variables, which are independent of each other, and an obtained distribution being of the following form:

$$\Delta r_l \sim N(\vec{0}, \sigma_l^2)$$

$$\Delta r_d \sim N(\vec{0}, \sigma_d^2)$$

wherein $\vec{0}$ denotes n-element zero vector, $\sigma_l^2 = [\sigma_{l,1}^2, \sigma_{l,2}^2, \ldots, \sigma_{l,n}^2]$ denotes a vector consisting of variances of the local process errors of n memristors on the memristor memory, $\sigma_d^2 = [\sigma_{d,1}^2, \sigma_{d,2}^2, \ldots, \sigma_{d,n}^2]$ denotes a vector consisting of variances of the dynamic errors of n memristors on the memristor memory, and $\sigma_l^2$ and $\sigma_d^2$ are both measured experimentally;

(1-4) obtaining a modeling representation of an actual conductance value g of the memristor on the memristor memory corresponding to the neural network weight under the influence of the process error and the dynamic error by utilizing results of (1-1) to (1-3), which is the Gaussian random variable as follows:

$$g \sim N(_0 + \Delta g_g, f(g_0 + \Delta g_g) \circ f(g_0 + \Delta g_g) \circ (\sigma_l^2 + \sigma_d^2))$$

wherein $\circ$ represents the Hadamard product of the matrix;

(1-5) mapping the actual conductance value of the memristor on the memristor memory under the influence of the process error and the dynamic error obtained in the step (1-4) into the neural network weight by utilizing a conductance value-weight mapping relationship, wherein the mapping relationship expression and the obtained statistical distribution of weights w are represented as follows:

$$w = c_0 + c_1 g \sim N(\mu, \Psi(\mu))$$

$$= N(c_0 + c_1(g_0 + \Delta g_g), c_1 f(g_0 + \Delta g_g) \circ f(g_0 + \Delta g_g) \circ (\sigma_l^2 + \sigma_d^2))$$

wherein $\mu$ and $\Psi(\mu)$ are the mean value and the variance of w, respectively; $c_0$ and $c_1$ are two constant factors of the conductance value-weight linear mapping, and can be computed through the following mode:

$$c_1 = \frac{w_{max} - w_{min}}{g_{max} - g_{min}}, c_0 = w_{min} - c_1 g_{min}$$

wherein $w_{max}$ and $w_{min}$ are a maximum value and a minimum value of all weights in the neural network respectively and can be obtained from the traditional neural network training, and $g_{max}$ and $g_{min}$ are a maximum value and a minimum value of the conductance range that can be adjusted by the memristor on the memristor memory, respectively. At this point, the modeling of the actual weight value on the cross-point matrix under the influence of fabrication error and dynamic error is completed.

(2) Performing Bayesian neural network training based on variational inference by taking a distribution form of the actual weights w obtained by modeling in the step (1) as the prior distribution of a Bayesian network, thus obtaining a variational posterior distribution $q(w|\theta)$ of the weights w, wherein $\theta$ is the parameter for controlling the form of the posterior distribution, specifically comprising the following steps:

(2-1) constructing a group of Gaussian distributions $q(w|\theta)$ controlled by a group of parameters $\theta$, wherein the parameters $\theta$ denote the mean value and standard deviation of each Gaussian distribution;

(2-2) minimizing the following target functions:

$$-\text{ELBO}(g_0; \theta) = -\mathbb{E}_{q(w|\theta)}[\log P(D|w)] + \text{KL}[q(w|\theta)P(w)]$$

obtaining the variational posterior distribution $q(w|\theta)$ of the weights w, wherein $g_0$ is a vector consisting of the target conductance values of various memristors on the memristor memory corresponding to all weights of the neural weight, $P(D|w)$ is the likelihood, $\mathbb{E}$ is expectation of solving random variables, $KL$ is a relative entropy of two distributions, $P(w)$ is the prior distribution of the weights, and D is a neural network training set.

(3) Computing the mean value $\Theta_\mu$ of the variational posterior $q(w|\theta)$ of the weights $w$, and mapping the mean value into the conductance by using a weight-conductance mapping relationship to obtain a target conductance value $g_w$ for being written into the cross-point matrix.

The robustness optimization method provided by the present invention fully considers the influence of various non-ideal factors in a circuit under the actual condition, and fully summarizes and models the influence of the non-ideal factors on the neural network weights, and a posterior distribution with strong robustness is obtained after the obtained model is trained by using the Bayesian network, and the mean value of the weight distributions is used as a target weight to be written into the cross-point matrix. Even if the mean value is affected by the fabrication error and dynamic noise of the circuit after being written into, and the actual value has a certain deviation compared with the target value, relatively high neural network inference accuracy can still be obtained. Compared with the conventional neural network training method based on the deterministic weight, the method provided by the present invention has great advantages in terms of neural network computing based on the memristor memory by utilizing prior information of non-ideal factors of a circuit; and compared with other statistical learning methods, a Bayesian network has characteristics of being clear in expression, clear in principle, simple in operation, better in performance and the like, and has remarkable advantages in practical application.

The effects of the present invention are further described below in conjunction with examples and experimental results.

Example 1: without loss of generality, an example of a multi-layer Bayesian convolutional neural network BLeNet and data and MNIST is constructed, and python +Pytorch is used as a software platform for this example.

The multi-layer Bayesian convolutional neural network BLeNet involved in the example is based on a classical convolutional neural network LeNet, a structure of which comprises two convolutional layers, two pooling layers, and three fully connected layers, parameters of each layer being as follows:

a convolutional layer Conv1: six convolution kernels of 5*5*1 are provided, an original dataset image with the specification of 32*32*1 is input, and a feature map with the scale of 28*28*6 is output;

a pooling layer P2: a feature map of 14*14*6 is output, a unit of each output feature map is connected to four units in a 2*2 neighborhood, which are not overlapped pairwise, of the input feature map, and the value of the unit is obtained by averaging the values of the corresponding four units;

a convolutional layer Conv3: sixteen convolution kernels of 5*5*6 are provided, the input specification is 14*14*6, and the feature map with the specification of 10*10*16 is output;

a pooling layer P4: an output feature map of 5*5*16 is generated, and a unit of each feature map are connected to four units in a 2*2 neighborhood, which are not overlapped pairwise, of the input feature map, and the value of the unit is obtained by averaging the values of the corresponding four units;

a fully connected layer FC5: an input feature vector is a vector with the length of 400 obtained by expanding the input feature map of the P4, and the length of an output feature vector is 120;

a fully connected layer FC6: an input feature vector has a length of 120, and an output feature vector has a length of 84;

a fully connected layer FC7: an input feature vector has a length of 84, and an output feature vector has a length of 10; and the ReLU function is chosen for the activation functions in both the convolutional layer and the fully connected layer.

The MNIST dataset used in the example comprises 60,000 training samples and 10,000 test samples, each sample is a 28*28 pixel gray-scale handwritten digital picture, each picture comprises one of the numbers 0-9, and all datasets can be classified into 10 categories according to different numbers contained in the pictures. To make the dataset match with the network structure, the 28*28 image of the MNIST dataset is filled to 32*32 pixels by zero padding around to be used as a feature map input to the Conv1 layer.

To perform training by using the Bayesian neural network, the convolutional layer and the fully connected layer in Pytorch need to be partially modified;

the Bayesian neural network is based on Bayesian inference, and is a parameter estimation method of the Bayesian probability theory belonging to the Bayesians of mathematical statistics. The Bayesian probability theory assumes that things have a certain non-determinacy (i.e., a to-be-estimated variable in the system is regarded as a random variable, and the purpose of parameter estimation is to find or approach the distribution of the to-be-estimated variable rather than the true value of the to-be-estimated variable), and an observer is in a certain knowledge state of the things (i.e., all to-be-estimated variables in the system have certain prior distribution, and the prior distribution can be obtained through previous knowledge of the observer), Bayesian inference partially corrects the prior probability distribution by observing characteristics expressed by the sample to obtain the posterior distribution of the to-be-estimated random variables, i.e., an estimation result based on the sample of the to-be-estimated variables.

Figure 3:
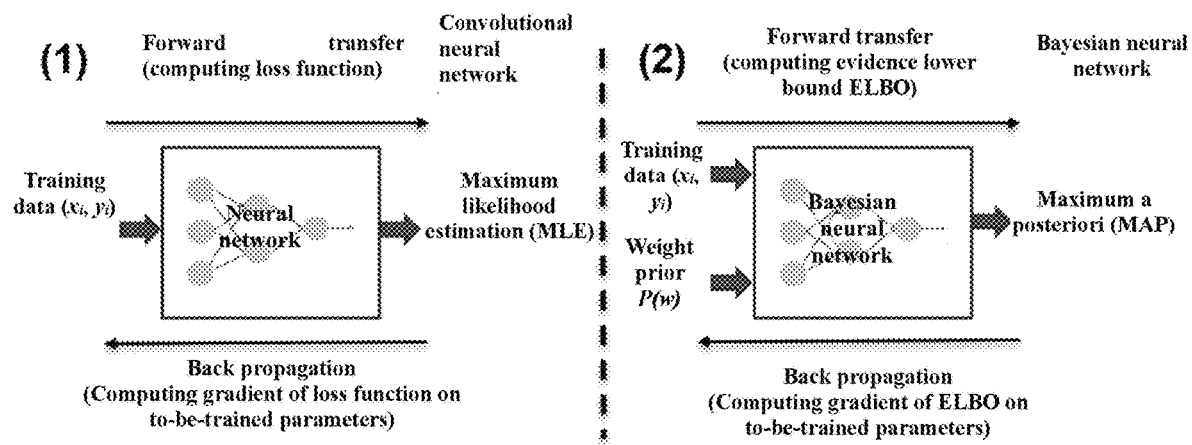
FIG. 3 is a comparison diagram of training methods of a Bayesian neural network and a conventional neural network.

As shown in FIG. 3, which is a comparison diagram of training methods of a Bayesian neural network and a conventional neural network. The Bayesian neural network has a network structure similar to that of an artificial neural network (ANN), which regards the posterior distribution of all to-be-trained parameters rather than the true value as a learning target, i.e., the parameters such as weights, biases and the like of the convolutional layer, the fully connected layer and the like of the network should be used in the form of a statistical distribution rather than some definite value. During practical application, for the neural network in any scale, the exact posterior distribution of the parameters is all insolvable, and therefore, the posterior distribution is usually approximately replaced with the Gaussian distribution, or referred to as variational posterior distribution, and estimation of distribution of the to-be-trained parameters is then translated into point estimation of the mean value and the variance of the variational posterior of the to-be-trained parameters.

In this example, the Bayesian convolutional layer (Bconv) and the Bayesian fully connected layer (BFC) need to be defined, by taking the Bayesian convolutional layer Bconv as an example, the mean value $\theta_\mu$ and the variance $\theta_\sigma$ of the variational posterior distribution $q(w|\theta)$ of all weights w contained in the Bconv layer are simultaneously registered as Pytorch model parameters (Parameter). A Monte Carlo method is adopted for the computation between the random variables, i.e., the random variables in the Bayesian model are repeatedly sampled to perform deterministic computation with sampling values, thus ultimately obtaining the deterministic output; specifically, during forward propagation, whenever one sample is input, the sampling is conducted according to the mean value $\theta_\mu$ and the variance $\theta_\sigma$ of the variational posterior distribution of the weights w to obtain the weight sampling value $w_s$ for forward computation; and during back propagation, the gradient of the mean value $\theta_\mu$ and the variance $\theta_\sigma$ of the variational posterior distribution of the weights w is computed by using the deterministic target function, and the mean value and the variance are updated to finish a round of training.

To obtain the weight posterior distribution P(w) required for the Bayesian network training, the weight modeling is conducted according to the step (1) in the specification to obtain a statistical distribution of the weights under the influence of the process error and the dynamic error:

$$w \sim N(\mu, \Psi(\mu)) = N(c_0 + c_1(g_0 + \Delta g_g), c_1 f(g_0 + \Delta g_g) \circ f(g_0 + \Delta g_g) \circ (\sigma_f^2 + \sigma_d^2))$$

the statistical distribution of the actual conductance values of the corresponding memristors is as follows:

$$g \sim N(g_0 + \Delta g_g, f(g_0 + \Delta g_g) \circ f(g_0 + \Delta g_g) \circ (\sigma_f^2 + \sigma_d^2))$$

in above distribution, $g_0$ is a to-be-trained parameter, $\Delta g_g$, $\sigma_f^2$ and $\sigma_d^2$ are quantities that need to be obtained by experimental measurements, and without loss of generality, by taking one memristor at a specific location of the memristor memory, the measurement method is as follows:

(1) manufacturing a plurality of memristor memory chips with the same design, and writing certain target conductance values into the memristors at the specific positions in these memristor memory chips according to the same method, and repeatedly measuring of the actual conductance values of the memristors at the specific positions to obtain measured values of the actual conductance values of the memristors at the specific positions, and evaluating differences between the measured values and the target conductance values to obtain the conductance errors of the memristors at the specific positions of all memristor memory chips;

(2) averaging the conductance errors of the memristors at the specific positions of all memristor memory chips to obtain the global conductance errors of the memristors at the specific positions, and measuring with the same method to obtain the global conductance errors $\Delta g_g$ of the memristors at all positions; and selecting different target conductance values, and averaging the target conductance values by repeating above steps for several times, thus improving the reliability of the obtained global conductance error; and (3) by use of the global conductance error obtained in the (2), computing a value of the error function of the memristor at the specific position by using the error function $f(g_0 + \Delta g_g)$, and dividing the conductance error of the memristor at the specific position by the value of the error function to obtain a process error value and a dynamic error value of the memristor at the specific position, and computing sample variances of the process error values and the dynamic error values of the memristors at the specific positions of all the memristor memory chips to obtain the $\sigma_l^2 + \sigma_d^2$.

At this point, in addition to the to-be-trained parameters $g_0$, the form of the prior distribution of the parameters in the BLeNet has been determined.

The target function of the BLeNet is as follows:

$$-\text{ELBO}(g_0; \theta) = -\mathbb{E}_{q(w|\theta)}[\log P(D|w)] + \text{KL}[q(w|\theta)P(w)]$$

in this function, the first term $-\mathbb{E}_{q(w|\theta)}[\log P(D|w)]$ is the likelihood cost, the likelihood $P(D|w)$ can be replaced with a cross entropy of a classifier output vector and a sample label, the likelihood cost reflects degree of fit of the model parameters to the training set; the higher the degree of fit, the smaller the term; the second term $+\text{KL}[q(w|\theta)||P(w)]$ is the complexity cost, which reflects the level of similarity (KL divergence or a relative entropy) of the posterior distribution and the prior distribution of the parameters, the higher the level of similarity degree, the smaller the term.

The training process of the BLeNet is to minimize ELBO (evidence lower bound) by using a mini-batch gradient descent method. During the training, the model convergence can be accelerated by utilizing the Momentum and the other methods used in the traditional artificial neural network training, the to-be-trained parameters are the target conductance value go contained in the prior distribution, and the mean value and the variance of the variational posterior distribution of the parameters such as weights, biases and the like in the model, thus the variational posterior distribution of the trained model parameters is obtained.

The variational posterior distribution of the model parameters is the Gaussian distribution determined by the mean value and the variance. Due to the existence of the complexity cost in the training process, there is a certain variance in the posterior distribution to maintain a higher overall similarity with the prior distribution; and meanwhile, due to the existence of the likelihood cost and the sampling operation on the posterior distribution in the training process, a parameter sampling value which is not far away from the mean value of the posterior distribution of the parameters can also enable the neural network to have higher inference accuracy, so that the neural network computing based on the memristor memory has a certain robustness.

For a specific memristor on a specific memristor memory chip, the conductance value thereof is a deterministic value rather than a random variable, and therefore, the neural network running on the memristor memory should be the traditional artificial neural network rather than the Bayesian neural network.

Based on above facts, the mean value of the variational posterior distribution of the parameters of the BLeNet obtained by training is used as the weight value of the LeNet running on the memristor memory, and the weight value is written into the memristor memory as the target conductance value after the weight-conductance linear mapping transformation. Even if the actual conductance value generates a certain offset relative to the target conductance value under the influence of the process error and the dynamic error in the writing process, the neural network running on the memristor memory can still keep high inference accuracy.

Figure 4:
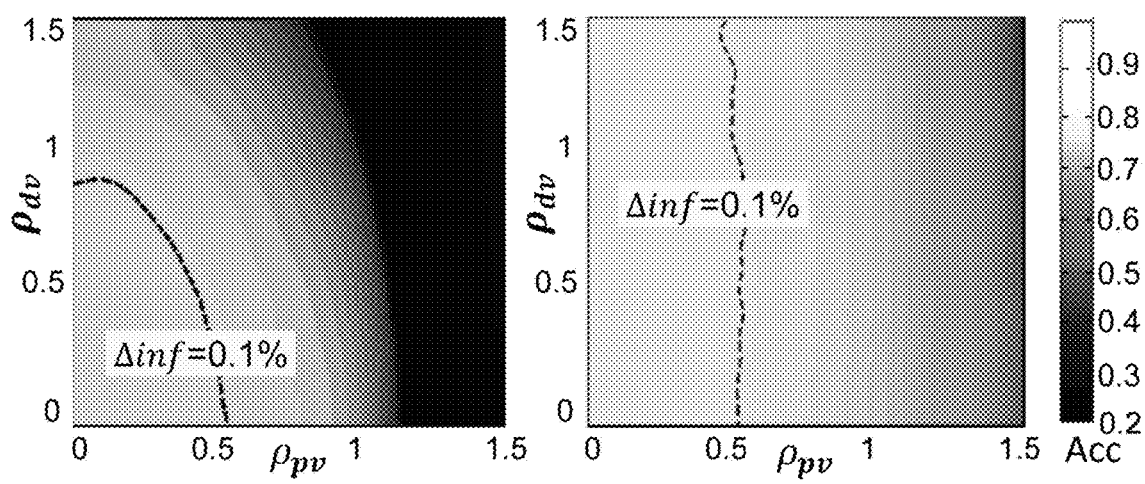
FIG. 4 is a comparison diagram of accuracy of performing neural network inference based on a memristor memory after applying a neural network training method provided by the present invention.

The effect of the example is as shown in FIG. 4, in the figure, $P_{pv}$ is the process error level which reflects the variance $\sigma_l^r$ of the global conductance error $\Delta g_g$ and the local process error; $P_{dv}$ is the dynamic error level which reflects the variance $\sigma_d^2$ of the dynamic error; and the gray scale in the figure is related to the inference accuracy Acc of the neural network, the darker the gray scale, the lower the inference accuracy.

The figure also gives a contour line of $\Delta_{inf}=0.1\%$ represented by a dotted black line, where $\Delta_{inf}$ is an inferring accuracy relative decrease factor, which is defined as follows:

$$\Delta_{inf} = 1 - \frac{\text{Inference accuracy of the neural network based on the memristor memory under the influence of the process error and the dynamic error}}{\text{Inference accuracy under ideal conditions}}$$

wherein the inference accuracy under the ideal condition refers to the inference accuracy obtained by performing neural network training and inference on a traditional computer platform such as a Von Neumann system by applying the traditional neural network training method based on deterministic network parameters.

Through the application of the traditional neural network training method based on the deterministic network parameters, the MNIST dataset is used for training to obtain an LeNet model, a corresponding error value is added to a weight value of the LeNet model to obtain an actual weight value under the process errors and the dynamic errors of different levels, and the actual weight value is used for inferring on the test set. The relationship between the corresponding inference accuracy and the process error level $P_{pv}$ as well as the dynamic error level $P_{dv}$ is as shown in the left side of FIG. 4, and the result shows that the inference accuracy decreases severely as the error level increases gradually; and in the upper right region, the inference accuracy decreases below 0.3, but the inference accuracy of the LeNet on the MNIST dataset usually exceeds 95% under ideal conditions.

Correspondingly, the method is applied to BLeNet training to obtain the posterior distribution of model parameters, and the mean value of the posterior distribution is written into the memristor memory; the corresponding inference accuracy of the LeNet based on the memristor memory, the corresponding relationship between the inference accuracy and the process error level $\rho_{pv}$ as well as the dynamic error level $\rho_{dv}$ are as shown in the right side of FIG. 4, and the result shows that the decrease degree of the inference accuracy is extremely limited as the error level increases gradually, and the inference accuracy of 0.7 or higher can still be maintained within the process error range and the dynamic error range shown in the figure, which is greatly improved in comparison with that in the traditional training method. Particularly, the area enclosed by the contour line of the inference accuracy decrease factor $\Delta_{inf}$=0.1% shown in the right side of FIG. 4 is obviously increased in comparison with that shown in the left side of the FIG. 4, indicating that the training method provided by the present invention has excellent optimization effect on the accuracy of the neural network inference based on the memristor memory.

Example 2: in accordance with a method similar to the example 1, a Bayesian convolutional neural network BAlexNet is constructed based on a convolutional neural network AlexNet, a modeling result of the process error and the dynamic error is used for providing prior for the BAlexNet, and a CIFAR-10 dataset and a CIFAR-100 dataset are respectively used to perform Bayesian neural network training, the mean value of the weight posterior distribution obtained by training is used as the neural network weight based on the memristor memory to test the inference accuracy of the neural network and calculate the inference accuracy relative decline factor $\Delta_{inf}$; compared with the data obtained by the conventional training method, a comparison result is as shown in Table 1, which indicates that, for complex large neural network models, when the method provided by the present invention is applied to training, relatively low accuracy decrease can be maintained when computation is conducted on the memristor memory, and the optimization effect is obvious compared with that of the traditional method.

TABLE 1

Inference accuracy relative decrease factor $\Delta_{inf}$

| Dataset | Training method | Process error level $p_{pv}$ (dynamic error level $p_{dv}$ = 0.15) | | |
| --- | --- | --- | --- | --- |
| | | 0.5 | 1 | 1.5 |
| CIFAR-10 | Traditional method | 6.3% | 27.9% | 45.7% |
| | The present invention | 0.2% | 0.4% | 0.4% |
| CIFAR-100 | Traditional method | 23.0% | 37.8% | 49.7% |
| | The present invention | 0.8% | 1.4% | 2.5% |

As above, the memristor memory-orientated neural network training method for a process error and a dynamic error is provided by the present invention, based on the understanding of non-ideal factors of a circuit such as a process error and dynamic noise obtained in an experiment, the influence of the non-ideal factors such as the process error and the dynamic noise on a conductance value (namely the neural network weight) of the cross-point matrix is modeled. A Bayesian neural network training method based on variational inference is used for training to obtain a posterior distribution of the weights. The training method provided by the present invention makes full use of prior knowledge such as the non-ideal factors of the circuit and the like and the robustness characteristic of the Bayesian network to achieve inference accuracy optimization of the neural network computing based on the memristor memory, so that the practical application feasibility of performing the neural network acceleration by using the memristor memory is achieved.

Above embodiments are used to explain and describe the present invention rather than limiting the present invention, and any modifications and changes made to the present invention within the scope of protection of the spirit and claims of the present invention shall fall within the scope of protection of the present invention.

What is claimed is:

1. A neural network training method for a memristor memory for memristor errors, comprising the following steps:
   step 1: performing modeling on neural network weights to be deployed on the memristor memory under the influence of a process error and a dynamic error, which comprises the following steps:
      step 1-1: decomposing an actual conductance value of one memristor on the memristor memory corresponding to each of the neural network weights into four parts: a target conductance value, a global conductance error, a local conductance error, and a dynamic conductance error,
      step 1-2: approximating the local conductance error and the dynamic conductance error as products of a value of an error function taking the target conductance value as a variable and a local process error as well as the dynamic error;
      step 1-3: respectively modeling the local process error and the dynamic error as Gaussian random variables, which are independent of each other;
      step 1-4: obtaining modeling representation of the actual conductance value of one memristor on the memristor memory corresponding to each of the neural network weights under the influence of the process error and the dynamic error by means of results of the steps 1-1 to 1-3, which is a Gaussian random variable, wherein a mean value of the modeling representation is the sum of the target conductance value and the global conductance error, and a variance is a product of a square of the value of the error function taking the target conductance value as the variable and the sum of the variances of two Gaussian random variables corresponding to the local process error and the dynamic error; and
      step 1-5: mapping the conductance value obtained by modeling into the neural network weights by using a conductance value-weight mapping relationship, thus obtaining statistical representation of the neural network weights;
   step 2: performing Bayesian neural network training based on variational posterior by taking a statistical distribution of the neural network weights obtained by modeling in the step 1 as a prior distribution of the neural network weights, thus obtaining a variational posterior distribution of the neural network weights; and
   step 3: computing a mean value of the variational posterior distribution of the neural network weights obtained in the step 2, mapping the mean value into a conductance by reversely using the conductance-weight mapping relationship, and taking the conductance as the actual conductance value of the memristor on the memristor memory.

2. The neural network training method for the memristor memory for memristor errors according to claim 1, wherein in the step 1-2, the error function taking the target conductance value as the variable is of the following form:

$$f(g_0) = cg_0$$

wherein c is a constant indicating a process error level and a dynamic error level, and is set according to an error level in an application scenario; and $g_0$ is a vector consisting of the target conductance value of each memristor on the memristor memory.

3. The neural network training method for the memristor memory for memristor errors according to claim 1, wherein in the step 1-3, the Gaussian random variable $\Delta r_l$ for representing the local process error and the Gaussian random variable $\Delta r_d$ for representing the dynamic error obtained by modeling respectively meet the following Gaussian distributions:

$$\Delta r_l \sim N(0, \sigma_l^2)$$

$$\Delta r_d \sim N(0, \sigma_d^2)$$

wherein $\sigma_l^2$ and $\sigma_d^2$ are variances of the two Gaussian distributions respectively and are measured experimentally, N indicating the Gaussian distribution.

4. The neural network training method for the memristor memory for memristor errors according to claim 1, wherein in the step 1-4, the modeling representation obtained by modeling to represent the actual conductance value of one memristor on the memristor memory corresponding to each of the neural network weights under the influence of the process error and the dynamic error is of the following form:

$$g \sim N(g_0 + \Delta g_g, f(g_0 + \Delta g_g)^2(\sigma_l^2 + \sigma_d^2))$$

wherein g is the actual conductance value, $g_0$ is the target conductance value, $\Delta g_g$ is the global conductance error, $\sigma_l^2$ and $\sigma_d^2$ are variances of the two Gaussian distributions respectively, and parameters are all measured experimentally.

5. The neural network training method for the memristor memory for memristor errors according to claim 1, wherein in the step 1-5, an i-th element $w_i$ of the neural network weights $w = [w_1, w_2, \ldots, w_i, \ldots, w_n]^T$ obtained through the conductance value-weight mapping relationship is of the following form:

$$w_i = c_0 + c_1 g_0 \sim N(\mu_i, \Psi(\mu_i)) = N(c_0 + c_1(g_{0,i} = \Delta g_{g,i}), c_1 f (g_{0,i} + \Delta g_{g,i})^2(\sigma_{l,i}^2 + \sigma_{d,i}^2))$$

wherein $g_i$ is an actual conductance value of a memristor corresponding to an i-th neural network weight, $\mu_i$ and $\Psi(\mu_i)$ are a mean value and a variance of $w_i$ respectively, $g_{0,i}$ is a target conductance value of the memristor corresponding to the i-th neural network weight, $\Delta g_{g,i}$ is a global conductance error of the memristor corresponding to the i-th neural network weight, $\sigma_{l,i}^2$ and $\sigma_{d,i}^2$ are variances of the local process error value and a dynamic error value of the memristor corresponding to the i-th neural network weight respectively, and $c_0$ and $c_1$ are two constant factors of conductance value-weight linear mapping, which are computed through the following expression:

$$c_1 = \frac{w_{max} - w_{min}}{g_{max} - g_{min}}, c_0 = w_{min} - c_1 g_{min}$$

wherein $w_{max}$ and $w_{min}$ are a maximum value and a minimum value of all the neural network weights in the neural network respectively, and are obtained from the traditional neural network training, and $g_{max}$ and $g_{min}$ are a maximum value and a minimum value of the conductance range that can be adjusted by the memristor on the memristor memory, respectively.

6. The neural network training method for the memristor memory for memristor errors according to claim 1, wherein in the step 2, the variational posterior distribution $q(w|\theta)$ of the neural network weights w is Gaussian distribution, $\theta$ is parameters of the Gaussian distribution, including the mean value and the variance, and a target function for the Bayesian neural network training based on variational inference is of the following form:

$$-\mathrm{ELBO}(g_0; \theta) = + \mathbb{E}_{q(w|\theta)}[\log P(D|w)] + \mathrm{KL}\ [q(w|\theta) P(w)]$$

wherein $g_0$ is a vector consisting of target conductance values of various memristors on the memristor memory corresponding to all the neural network weights of the neural network, $P(D|w)$ is likelihood, $\mathbb{E}$ is expectation of solving random variables, KL is a relative entropy of solving two distributions, $P(w)$ is the prior distribution of the weights, and D is a neural network training set.

* * * * *